United States Patent
Yamada

[11] Patent Number: 6,159,756
[45] Date of Patent: Dec. 12, 2000

[54] METHOD OF TESTING SEMICONDUCTOR DEVICE

[75] Inventor: Yoshiaki Yamada, Tokyo, Japan

[73] Assignee: NEC Corporation, Tokyo, Japan

[21] Appl. No.: 09/235,756

[22] Filed: Jan. 25, 1999

Related U.S. Application Data

[62] Division of application No. 08/976,082, Nov. 21, 1997, Pat. No. 5,900,645.

[30] Foreign Application Priority Data

Nov. 21, 1996 [JP] Japan ................................. 8-310355

[51] Int. Cl.$^7$ .................................................. H01L 21/66
[52] U.S. Cl. ............................... 438/14; 438/800; 438/17
[58] Field of Search .................................. 438/14, 15–16, 438/17, 18, 401, 462, 800, 625, 672; 257/48, 750, 754, 767, 798

[56] References Cited

U.S. PATENT DOCUMENTS

| | | | |
|---|---|---|---|
| 5,514,974 | 5/1996 | Bouldin | ................................. 327/763 |
| 5,607,718 | 3/1997 | Sasaki et al. . | |
| 5,609,775 | 3/1997 | Liu . | |
| 5,614,114 | 3/1997 | Owen . | |
| 5,637,186 | 6/1997 | Liu et al. . | |
| 5,661,345 | 8/1997 | Wada et al. . | |

FOREIGN PATENT DOCUMENTS 4-65831  3/1992  Japan .
8-10693  1/1996  Japan .

*Primary Examiner*—Charles Bowers
*Assistant Examiner*—Craig Thompson
*Attorney, Agent, or Firm*—Young & Thompson

[57] ABSTRACT

A semiconductor device is tested without destroying a substrate immediately after a formation of a metal film and before patterning the metal film.

To this end, the substrate is first divided into a product region and a test pattern region. Next, an insulating film is formed on the substrate. Thereafter, openings are formed in the insulating film and on the product region and the test pattern region. Subsequently, the metal film is formed in the openings and on the insulating film. Finally, the metal film is patterned to form a wiring pattern.

Under these circumstances, a forming state of the metal film in the opening on the test pattern region is actually tested. Specifically, the presence or absence of a void is checked. In accordance with this test result, a forming state of the metal film in the opening in the product region is evaluated.

17 Claims, 6 Drawing Sheets

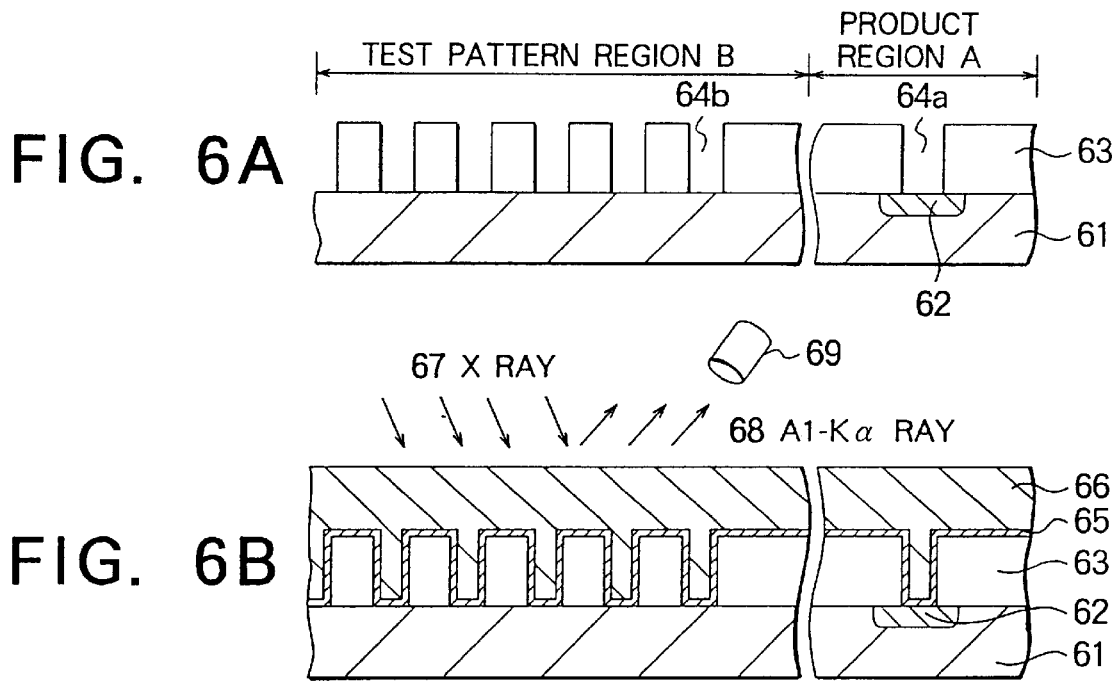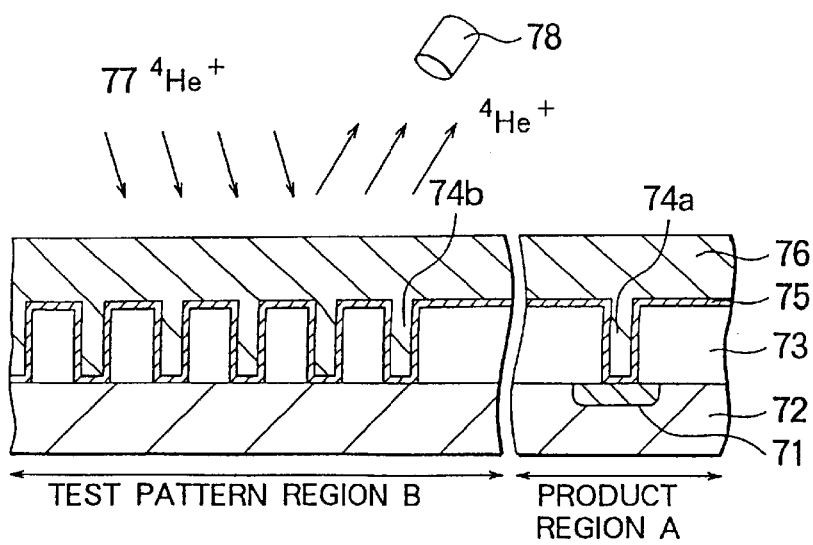

METHOD OF TESTING SEMICONDUCTOR DEVICE

CROSS-REFERENCE TO RELATED APPLICATIONS

This application is a division of application Ser. No. 08/976,082, filed Nov. 21, 1997 now U.S. Pat. No. 5,900,645.

BACKGROUND OF THE INVENTION

This invention relates to a semiconductor device and a method of testing the same and, in particular, to a method of checking a forming state of a metal film in an opening formed in an interlayer insulating film.

Recently, a diameter of an opening, such as a contact hole, a through hole and a via hole, has been reduced with a high integration of a semiconductor device. The opening is generally formed in an interlayer insulating film. In this case, an aspect ratio which is obtained by dividing a depth of the opening by the diameter has been increased because the depth of the opening is almost kept constant. Therefore, the opening is not sufficiently covered with a metal film, such as aluminum film, through the conventional sputtering method. Consequently, a connecting resistance becomes large, and further a disconnection often occurs.

To solve such problems, a proposal has been made about a method of filling the opening with tungsten through a chemical vapor deposition method (CVD). However, according to this method, a manufacturing duration increases and further, the manufacturing cost is increased. This is because the method has a plurality of manufacturing steps.

Therefore, a suggestion has been made about a method of embedding an aluminum film in the opening by reflowing aluminum through a heating process, as disclosed in Unexamined Japanese Patent Publications No. H4-65831 and H1-76736. However, according to this method, a void is often caused to occur in the aluminum film where the opening is not sufficiently filled with the aluminum. In this case, the void means a space which is left in the aluminum film after the reflow. The void increases a contact resistance and often causes a disconnection to occur. Thus, where the void remains in the aluminum film embedded in the opening, such a void can not be directly detected from the outside of the substrate by an optical microscope because the void is left inside the aluminum film. Accordingly, the substrate must be cleaved or cut to detect the void inside the aluminum film by Scanning Electron Microscope (SEM).

However, this method can not be directly adopted for an actual product because the product must be destroyed. Therefore, an additional substrate for monitoring is prepared besides the product substrate. This additional substrate is cleaved to detect the void. However, this method requires an additional cost for manufacturing the additional substrate. Further, a forming state of the aluminum film embedded in the opening is different from each other between the product substrate and the monitoring or additional substrate. Consequently, the product substrate itself can not be correctly tested even when the monitoring substrate is checked.

Therefore, another proposal has been made about a method of checking the forming state of the aluminum film by arranging a test pattern region in addition to a product region on the same substrate. For example, the test pattern region has a test pattern which connects the openings in series. In this circumstance, the serial resistance is measured after the aluminum wiring pattern is formed to check the forming state of the aluminum film in the opening. Namely, the presence or absence of the void in the aluminum film embedded in the opening is checked by measuring the serial resistance. Although the forming state of the aluminum film in the opening can be tested without destroying the substrate in this method, the test should be performed after completion of the aluminum wiring pattern. In other words, the test can not be performed in the above method before completion of the aluminum wiring pattern. As a result, a long duration is taken to detect the void. Consequently, a plurality of defective products having the void are manufactured before the void is detected. This increases the manufacturing cost.

Another testing method has been suggested to detect the void before the aluminum wiring pattern is completed. In this method, the test pattern region is also provided besides the product region on the same substrate. In this event, the aluminum film in the opening is etched in the test pattern region to detect the void when the aluminum film in the product region is etched to form an aluminum wiring pattern. In this case, the void is detected by the SEM. However, the test pattern region must also be etched to detect the void in the above method. Namely, the test pattern region must be destroyed. In addition, the test can not be performed before the etching of the aluminum film is completed to form the aluminum wiring pattern in the above method. As a result, a relatively long duration is required to detect the void. Consequently, a plurality of defective products having the void are manufactured before the void is detected. This increases the manufacturing cost.

SUMMARY OF THE INVENTION

It is an object of this invention to provide a test method which is capable of testing a semiconductor device, without destroying a substrate, immediately after a metal film is formed.

According to this invention, a substrate is first divided into a product region and a test pattern region. Next, an insulating film is formed on the substrate. Thereafter, openings are formed in the insulating film and on the product region and the test pattern region. Subsequently, a metal film is formed in the openings and on the insulating film. Finally, the metal film is patterned to form a wiring pattern.

Under these circumstances, a forming state of the metal film in the opening on the test pattern region is actually tested. Specifically, the presence or absence of a void is checked. In accordance with this test result, a forming state of the metal film in the opening in the product region is evaluated.

In this event, the test is performed without destroying the substrate immediately after the formation of the metal film and before the patterning of the metal film.

BRIEF DESCRIPTION OF THE DRAWINGS

FIGS. 6A and 6B show a method of testing a semiconductor device according to a second embodiment of this invention.

FIG. 7 show a method of testing a semiconductor device according to a third embodiment of this invention.

DESCRIPTION OF THE PREFERRED EMBODIMENTS

Referring to FIG. 1, a conventional method of testing a semiconductor device will be first described for a better understanding of this invention. The testing method is equivalent to a part of the conventional testing method mentioned earlier in the instant specification.

Figure 1A:
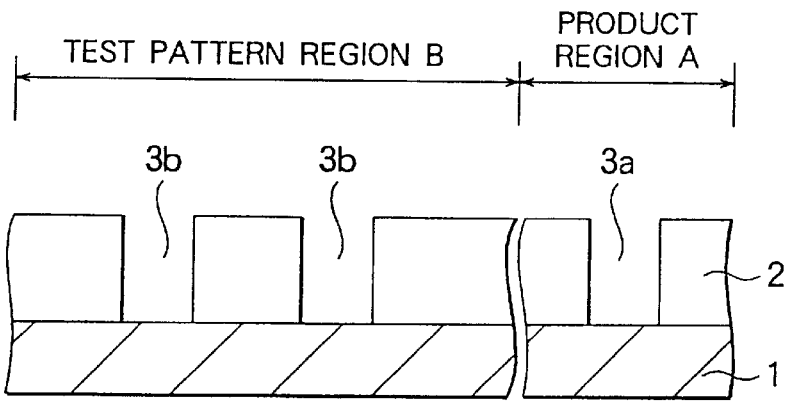
FIGS. 1A through 1C show a conventional method of testing a semiconductor device.

First, as shown FIG. 1A, a silicon substrate 1 is divided into a product region A and a test pattern region B. The product region A has a device forming region or a wiring pattern region. Next, a silicon oxide film 2 is deposited on the silicon substrate 1 as an interlayer insulating film by the use of the known CVD method. Subsequently, openings 3 are formed in the silicon oxide film 2 by the known lithography technique and dry-etching technique on the product region A and the test pattern region B and are depicted at 3a and 3b, respectively. The openings 3 reach the surface of the silicon substrate 1. In this case, the opening 3a on the product region A is substantially identical with the opening 3b on the test pattern region B in configuration and size.

Figure 1B:
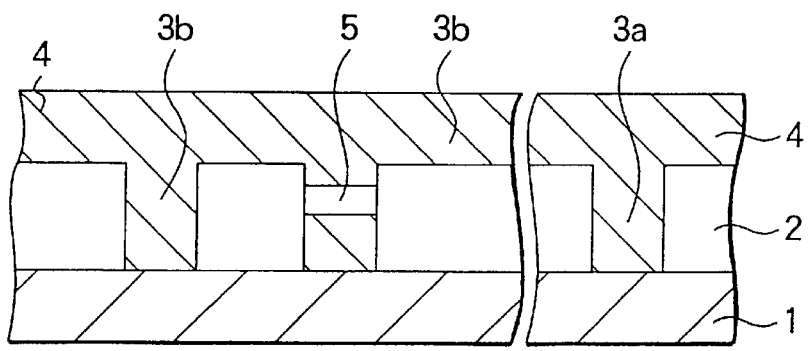

Subsequently, as shown in FIG. 1B, an aluminum alloy film 4 which includes Si and Cu is deposited in the openings 3 and on the silicon oxide film 2. Next, the openings 3 are filled with the aluminum alloy film 4 by reflowing the aluminum alloy through a heating process. In this event, a void 5 may be left in the opening 3b. In this condition, the void 5 can not be visibly detected from the outside of the substrate 1 through a microscope because the void 5 is formed inside the aluminum alloy film 4.

Figure 1C:
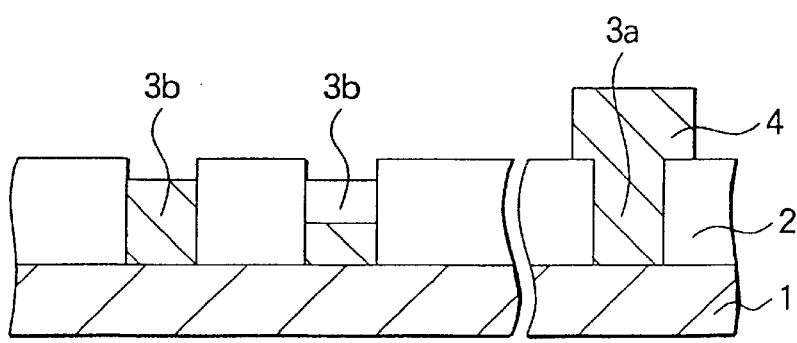

Next, as shown in FIG. 1C, the aluminum alloy film 4 is patterned or etched to form a aluminum wiring pattern on the product region A. At the same time, the aluminum alloy film 4 is etched on the test pattern region B. After the etching, the void 5 is visibly detected or observed on the test pattern region B by the SEM.

Thus, the test is performed to detect the void 5 in the conventional method. In the conventional method, the test is performed by etching the test pattern region B. In addition, the test is performed after the aluminum alloy film 4 is patterned. Therefore, it takes a relatively long duration to detect the void 5, as mentioned earlier.

Taking the above-mentioned problem into consideration, this invention provides a method of testing a semiconductor device without destroying the substrate immediately after the metal film is formed.

First Embodiment

Referring to FIG. 2, a description will be made about a testing method according to a first embodiment of this invention.

Figure 2A:
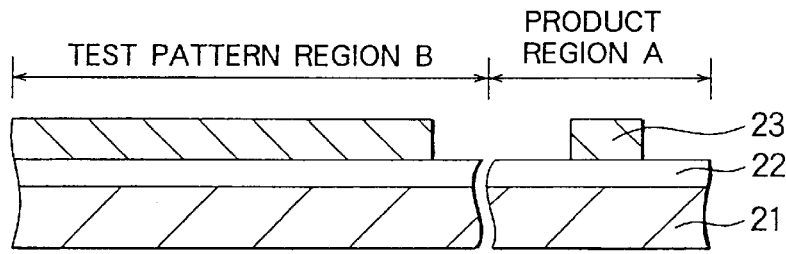
FIGS. 2A through 2D show a method of testing a semiconductor device according to a first embodiment of this invention.

As shown in FIG. 2A, the silicon substrate 21 is divided into a product region A and a test pattern region B, like in FIG. 1. The product region A has a device forming region (not shown) mentioned in conjunction with FIG. 1A. The illustrated test pattern region B has a square shape having each side between 1 to 2 mm. A silicon oxide film 22 is formed on the silicon substrate 21. Next, a first aluminum alloy film 23 is deposited on the silicon oxide film 22 and patterned into a wiring pattern. The first aluminum alloy film 23 has a film thickness of 0.2 to 0.6 $\mu$m.

Figure 2B:
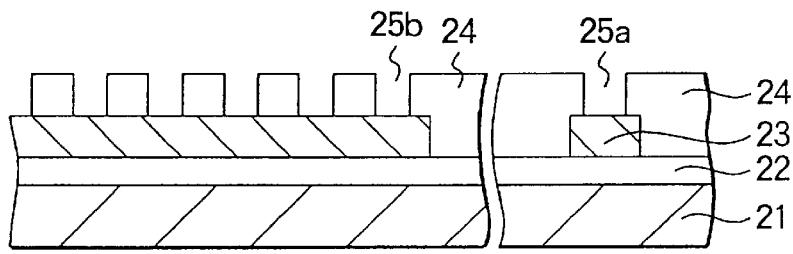
Figure 3:
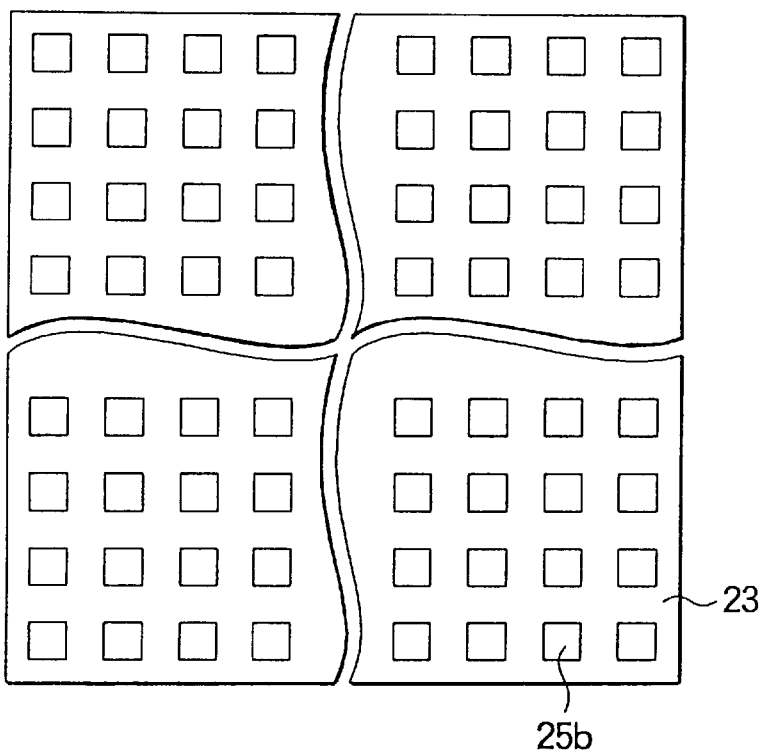
FIG. 3 shows a top view of a test pattern formed on a substrate.

Next, as shown in FIG. 2B, a silicon oxide film 24 is formed on the first aluminum alloy film 23 as an interlayer insulating film by the use of the known plasma CVD method. In this case, the silicon oxide film 24 may be deposited to thickness thicker than the first aluminum alloy film 23 and thereafter, may be flattened by the known Chemical Mechanical Polishing method (CMP) or by coating a SOG film. Subsequently, openings 25 are formed in the silicon oxide film 24 by the known lithography technique and dry-etching technique. The openings 25 reach the surface of the first aluminum alloy film 23. The opening 25a on the product region A has, for example, a diameter of 0.5 $\mu$m and a minimum interval of 0.5 $\mu$m, while the opening 8b on the test pattern region B has, for example, a diameter of 0.45 $\mu$m to 0.475 $\mu$m and an interval of 0.45 $\mu$m to 0.5 $\mu$m. Thus, the diameter and the interval of the opening 25b on the test pattern region B are different from or smaller than these of the opening 25a on the product region A. A top view of the test pattern region B is illustrated in FIG. 3. As shown in FIG. 3, the openings 25b having the small diameter are densely or closely arranged in the test pattern region B.

Figure 2C:
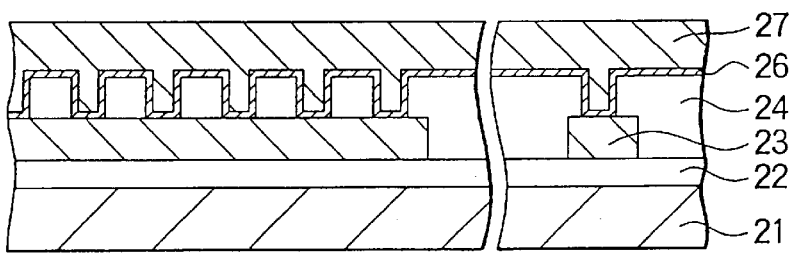

Subsequently, a Ti film 26 shown in FIG. 2C is deposited to a thickness of 10 $\mu$m to 50 $\mu$m by the known sputtering method on the silicon oxide film 24 and the first aluminum alloy film 23. Subsequently, a second aluminum alloy film 27 is deposited on the Ti film 26 to a thickness of 0.5 $\mu$m to 1.0 $\mu$m at a low temperature of about 150° C. or less through the sputtering method. After the deposition, the second aluminum alloy film 27 is reflowed so that the openings 25 are filled with the aluminum alloy.

In this event, the reflow is performed by heating the silicon substrate 21 at a temperature of 400° C. to 500° C. in a vacuum chamber kept at a high vacuum of $10^{-7}$ Torr or less. Under the above-mentioned conditions, no oxidation takes place on the surface of the second aluminum alloy film 27. The silicon substrate 21 is subjected to a heat treatment by blowing a heated Ar gas from the back surface of the silicon substrate 21.

Figure 2D:
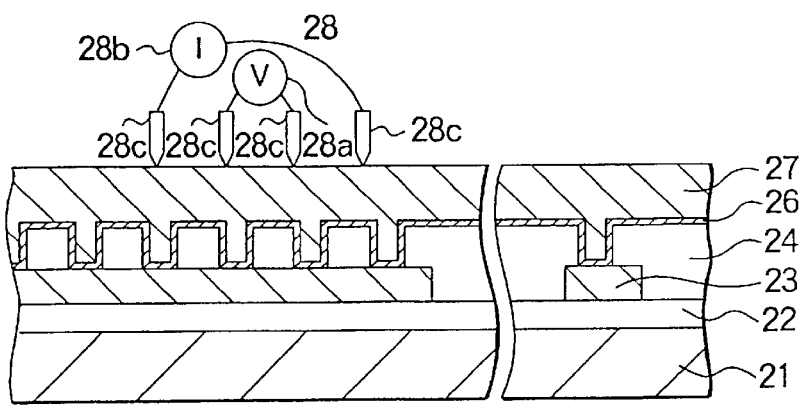

Subsequently, a sheet resistance is measured in the test pattern region B in a manner illustrated in FIG. 2D to check whether or not each opening 8 is sufficiently or completely embedded by the second aluminum alloy film 27. Namely, the presence or absence of voids in the second aluminm alloy film 27 is checked in the openings 25b. Practically, the embedded state of the openings is checked by comparing the measured sheet resistance with a sheet resistance of a region having no opening 25. The sheet resistance is measured by a four-point probe method known in the art. Specifically, the sheet resistance is measured by contacting probes 28c of a sheet resistance measuring device 28 with the surface of the second aluminum alloy film 27, as shown in FIG. 2D. Such a sheet resistance measuring device 28 usually has a voltmeter 28a and an ammeter 28b.

Figure 4:
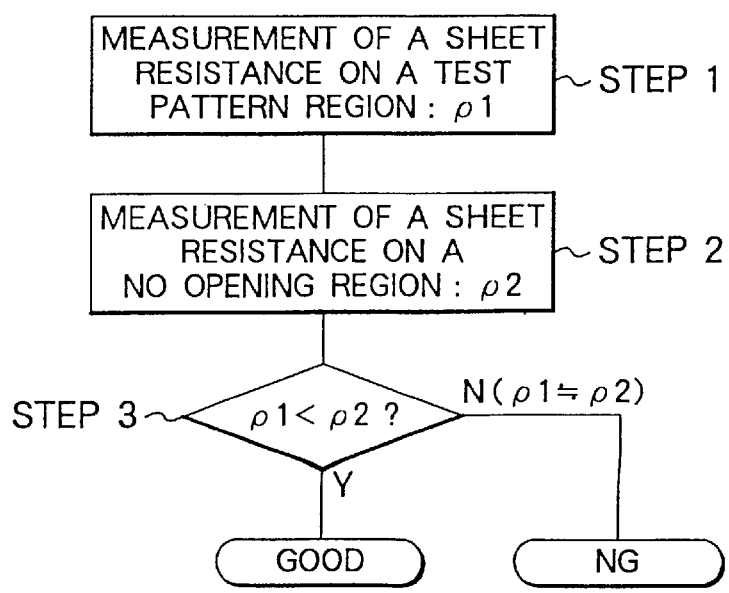
FIG. 4 is a flow chart showing a method of measuring a sheet resistance.

Next, a specific test method according to the first embodiment will be described together with FIG. 4.

Immediately after the second aluminum alloy film 27 is deposited and reflowed, the sheet resistance ($\rho_1$) is measured in the test pattern region B (step 1). Next, a sheet resistance ($\rho_2$) in the region having no openings are measured (step 2). Subsequently, both the resistances $\rho_1$ and $\rho_2$ are compared with each other (step 3). As a result of the comparison, if the sheet resistance ($\rho_1$) is lower than the sheet resistance ($\rho_2$), it is determined that the openings 25 is sufficiently embedded with the second aluminum alloy 27. Namely, it is judged that no voids exist on the test pattern B in the second aluminum alloy film 27 embedded in the opening 25b. As a result, the product region A is evaluated as an acceptable region. Specifically, where the opening 25 is sufficiently embedded, the embedded region is reduced by about 20% to 50% in the sheet resistance, as compared to the no opening region. This reason is explained as follows. That is, where the opening 25 is sufficiently or completely embedded, the second aluminum alloy film 27 is electrically connected with the first aluminum alloy film 23. Consequently, the sheet resistance becomes low.

On the other hand, if both the sheet resistances $\rho_1$ and $\rho_2$ are substantially identical to each other, it is determined that the openings 25 are not sufficiently embedded. Namely, it is judged that voids exist in the second aluminum alloy film 27 embedded in the opening 25b. This reason is explained as follows. That is, where the openings 25 are not sufficiently embedded, the second aluminum alloy film 27 is not electrically connected with the first aluminum alloy film 23 because of the voids. Consequently, the sheet resistance becomes high. As a result, the product region A is evaluated as a defective region.

In this case, the diameter of the opening 25b in the test pattern region B is smaller than that in the product region A. Further, a distance between the openings 25b in the test pattern region B is equal to that in the product region A or less. Therefore, the embedding of the openings 25b on the test pattern region B is more difficult than the embedding of the openings 25a in the product region A. As a result, if the openings 25b on the testing pattern region B are embedded to some extent, the openings 25a in the product region A are completely embedded. Thus, even if all of the openings 25b are not embedded, it is judged that the openings 25b are embedded in the measurement of the sheet resistance if a certain number of openings 25b are embedded. This is because the resistance of the test pattern region B becomes lower than the sheet resistance of the no opening region.

Herein, it is assumed that large differences are present between diameters of the openings 25 formed on both the product region A and the test pattern region B and that all of the openings 25a are embedded in the product region A. However, all openings 25b may not always be embedded by the aluminum alloy in the test pattern region B. As a result, the test pattern region B can not serve to monitor the voids in the product region A. Therefore, it is desirable that the diameter of each opening 25b in the test pattern region B is smaller by 5% to 10% than that in the product region A. Further, it is suitable that a distance among the openings 25b in the test pattern region B may be equal to the minimum distance among the openings 25a in the product region A or shorter than the latter by about 10%.

In the above first embodiment, the probes 28c of the sheet resistance measuring device 28 are directly contacted with the surface of the second aluminum alloy film 27. Consequently, needle marks due to the probes 28c remain on the surface of the second aluminum alloy film 27. In a result, the second aluminum alloy film 27 may be contaminated by an impurity and further, any particles may be attached the second aluminum alloy film 27.

Figure 5:
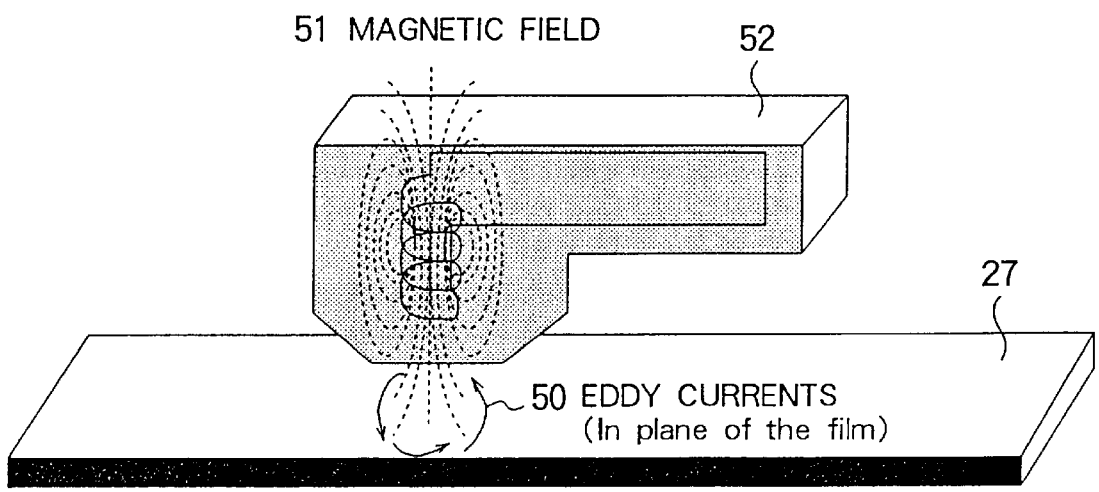
FIG. 5 show a method of measuring the sheet resistance by an eddy current method.

In order to prevent the contamination and the like, an eddy current method, which is capable of measuring the sheet resistance without contacting with the second aluminum alloy film 27, may be employed instead of the above-mentioned four-point probe method. In the eddy current method, the sheet resistance is measured by measuring an eddy current 50 in a manner illustrated in FIG. 5. In FIG. 5, the eddy current 50 is caused to flow in plane of the second aluminum alloy film 27 when a magnetic field 51 is varied. In this event, the magnetic field 51 is generated from a probe 52 which is close to the second aluminum alloy film 27 and which serves as an electromagnet. In this method, a difference of sheet resistances is small between the region wherein the openings 25b are embedded and the region wherein the openings 25b are not embedded in FIG. 2. This is because detection is made not only about information of the first aluminum alloy film 23 but also about information of the second aluminum alloy film 27. However, this method is effective in view of the fact that the sheet resistance can be measured without contacting with the aluminum alloy film 27, as mentioned before.

Second Embodiment

Referring to FIG. 6, description will be made about a testing method according to a second embodiment of this invention.

As shown in FIG. 6A, the silicon substrate 61 is divided into a product region A and a test pattern region B, like in the first embodiment. Next, an impurity diffusion region 62 is formed in the silicon substrate 61 within the product region A and serves as a device forming region. Subsequently, a silicon oxide film 63 is selectively left on the silicon substrate 61. The silicon oxide film 63 has a thickness of 1 $\mu$m to 1.5 $\mu$m. As shown in FIG. 6A, openings 64 are formed in the silicon oxide film 63 on both the product region A and the test pattern region B by the use of the known lithography technique and dry-etching technique. In this case, the openings 64 reach the surface of the silicon substrate 61. The openings 64b are denser in distribution in the test pattern region B than the product region A, like in FIG. 3. This test pattern region B has a square shape having a side of 100 $\mu$m to 100 $\mu$m. While a minimum diameter of the openings 64a and a minimum distance between the openings 64a in the product region A are set to 0.4 $\mu$m, each diameter of the openings 64b in the test pattern region B is set to 0.36 $\mu$m to 0.38 $\mu$m, and the distance between the openings 64b in the test pattern region B is set to 0.36 to 0.4 $\mu$m. Thus, the diameter of the opening 64b in the test pattern region B is smaller than that of the opening 64a in the product region A. Further, the distance between the openings 64b on the test pattern region B is substantially equal to that of the opening 64a in the product region A or smaller than the latter.

Subsequently, as shown in FIG. 6B, a Ti/TiN film 65 is formed on the silicon oxide film 63 and the silicon substrate 61 by successively depositing Ti and TiN by the use of the known sputtering method. In this case, the Ti is deposited to a thickness of 50 nm to 100 nm, while the TiN is deposited to a thickness of 100 nm to 150 nm. Thereafter, a thermal treatment is performed in a nitrogen atmosphere to enhance a barrier characteristic of the Ti/TiN film 65.

Next, an aluminum alloy film 66 is formed on the Ti/TiN film 65 to a thickness of 100 nm to 300 nm at a low temperature of 150° C. or less. Thereafter, the remaining aluminum alloy film 66 is formed to a thickness of 400 nm to 700 nm at a rate of 100 nm to 300 nm for one minute to embed the openings 64 with the aluminum alloy film 66 on the condition that the silicon substrate 61 is heated to 350° C. to 400° C.

Subsequently, a X-ray 67 which is focused by a colimeter (not shown) is irradiated onto the aluminum alloy film 66 on the test pattern region B to emit an Al-Kα ray 68 from the aluminum alloy film 66. The Al-Kα ray 68 which is a fluorescent X-ray of aluminum is measured in strength by a X-ray detector 69. If the openings 64b are embedded with the aluminum alloy film 66, the strength of the Al-Kα ray 68 becomes slightly small as compared to the region wherein the openings 64b are not embedded. Specifically, where the openings 64b are embedded, the emitted fluorescent X-ray is absorbed by the aluminum alloy film 66 over the opening 64b. On the other hand, where the openings 64b are not embedded, the absorbed quantity of the fluorescent X-ray is small.

Practically, a difference of the strength is scarcely observed between the region wherein the openings 64b are embedded and the region wherein the openings 64b are not embedded. Therefore, measurement is previously made about a first strength ratio of the Al-Ka ray 68 between the no opening region and the region wherein the openings 64b are completely embedded and a second strength ratio between the no opening region and the region wherein the openings 64b are not embedded. In this case, whether or not the openings 64b are embedded is judged by comparing the first and second strength ratios with the strength ratio between the no opening region and the test pattern region B having the dense openings 64b in an actual product.

Third Embodiment

Referring to FIG. 7, description will be made about a testing method according to a third embodiment of this invention.

The structure and the manufacturing method of the semiconductor device according to the third embodiment is equivalent to the method mentioned in conjunction with the second embodiment. That is, a silicon substrate 71 is divided into a product region A and a test pattern region B. An impurity diffusion region 72 is formed in the silicon substrate 71 as a device forming region in the product region A. A silicon oxide film 73 is formed on the silicon substrate 71. Openings 74 are formed in the silicon oxide film 73 on the product region A and the test pattern region B. A Ti/TiN film 75 is deposited on the silicon oxide film 73 and the silicon substrate 71. Further, an aluminum alloy film 76 is formed on Ti/TiN film 75.

Figure 8A:
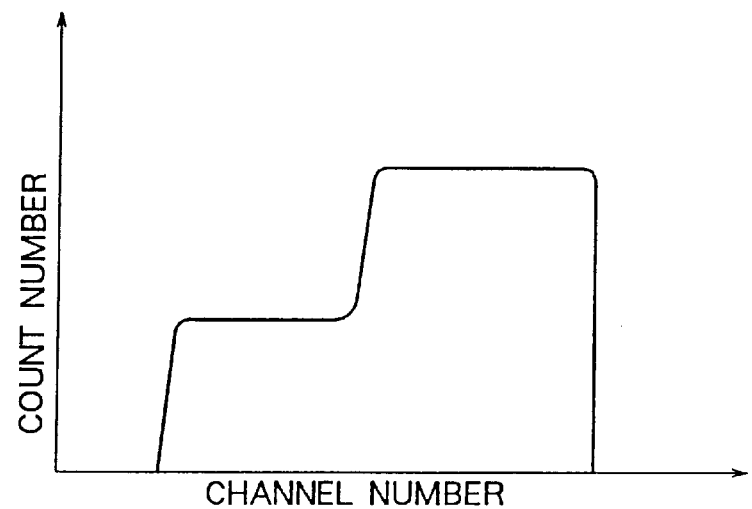
FIGS. 8A and 8B show spectrum obtained through Rutherford back scattering spectrometry.
Figure 8B:
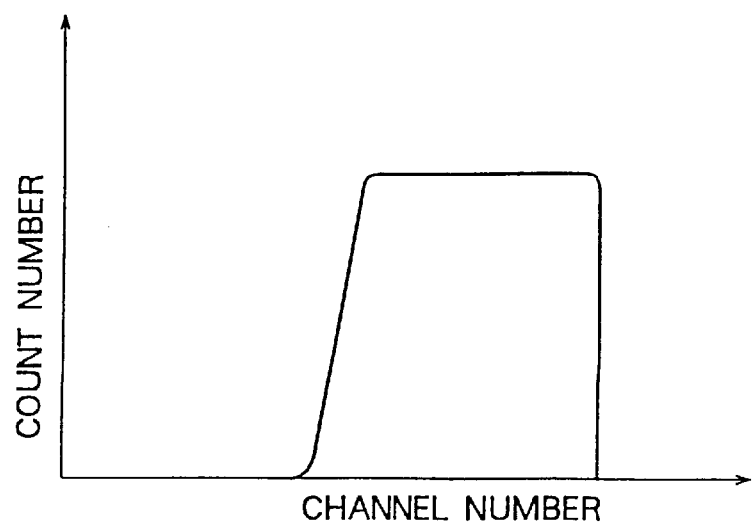

Herein, it is to be noted that the test method of this embodiment is different from that of the second embodiment. Namely, the test pattern region B is analyzed by Rutherford back scattering spectrometry (RBS) to determine an aluminum distribution of a depth direction for the substrate 71. Specifically, helium ions ($^4$He$^+$) 77 are irradiated onto the test pattern region B and scattered backwards therefrom. The scattered ions are detected by an ion detector 78 to determine a relation between a channel number (corresponding to the depth) and an ion count number, as shown in FIG. 7. The relation is illustrated as spectrum in the FIG. 8. For example, a spectrum determined by the helium ions accerelated to 2 MeV is illustrated in FIG. 8A where the openings 74b are embedded with the aluminum alloy film 76, while the spectrum is illustrated in FIG. 8B where the openings 74b are not embedded with the aluminum alloy film 76. Thus, whether or not the openings 74b are embedded with the aluminum alloy film 76 can be judged in accordance with the shape of the spectrum. In this case, it is noted that ions from the Ti/TiN film 75 and the silicon oxide film 73 under the aluminum alloy film 76 are not counted or excluded.

Although the aluminum alloy is used as a wiring metal film in the above embodiments, this invention is not limited to the aluminum alloy, and the other metals, such as copper, may be used instead of the aluminum alloy if the reflow can be performed. In addition, although the test pattern region B is assumed to be measured only once in the above embodiments, the test pattern region B may be repeatedly measured many times by changing positions. Further, a plurality of test pattern regions may be formed on the silicon substrate.

What is claimed is:

1. A method of testing a semiconductor device having a substrate, comprising the steps of:

dividing said substrate into a product region and a test pattern region;

forming an insulating film on said substrate;

forming openings in said insulating film and on said product region and said test pattern region;

forming a metal film in said openings and on said insulating film;

patterning said metal film to form a wiring pattern; and actually testing a forming state of said metal film in said opening on said test pattern region in order to evaluate a forming state of said metal film in said opening in said product region;

the test being performed without destroying said substrate immediately after the formation of said metal film and before the patterning of said metal film.

2. A method claimed in claim 1, wherein:

the opening on said test pattern region has a narrower width than that on said product region, and the density of the openings on said test pattern is higher than that on said product pattern.

3. A method claimed in claim 1, wherein:

the test is performed by measuring a sheet resistance of said metal film.

4. A method claimed in claim 3, wherein:

the sheet resistance is measured by a four-point probe method.

5. A method claimed in claim 3, wherein:

the sheet resistance is measured by measuring an eddy current when a magnetic field is applied to said metal film.

6. A method claimed in claim 1, wherein:

the test is performed by measuring a X-ray strength of said metal film when the X-ray is irradiated to said metal film.

7. A method claimed in claim 1, wherein:

the test is performed by measuring a depth distribution of said metal film obtained through Rutherford back scattering spectrometry.

8. A method claimed in claim 1, wherein:

said metal film is formed in the opening by reflowing the metal through a heating process.

9. A method claimed in claim 1, wherein:

said metal film comprises one selected from aluminum and copper.

10. A method claimed in claim 1, wherein:

said opening comprises one selected from a contact hole and a through hole.

11. A method claimed in claim 1, wherein:

the forming state of said metal film is tested by checking the presence or absence of a void in the opening.

12. A method of testing a semiconductor device having a substrate, comprising the steps of:

dividing said substrate into a product region and a test pattern region;

forming a first metal film on said substrate;

forming an insulating film on said first metal film;

forming openings in said insulating film and on said product region and said test pattern region, the opening being positioned on said first metal film;

forming a second metal film in said openings and on said first metal film, said second metal film having a sheet resistance;

patterning said second metal film to form a wiring pattern; and actually testing a forming state of said second metal film in said opening on said test pattern region by measuring the sheet resistance in order to evaluate a forming state of said second metal film in said opening on said product region;

the test being performed without destroying said substrate immediately after the formation of said second metal film and before the patterning of said second metal film.

13. A method claimed in claim 12, wherein:

said opening on said test pattern region has a narrower width than that on said product region, and the density of the openings on said test pattern is higher than that on said product pattern.

14. A method of testing a semiconductor device having a substrate, comprising the steps of:

dividing said substrate into a product region and a test pattern region;

forming an impurity diffusing layer in said product region;

forming an insulating film on said substrate;

forming openings in said insulating film on said product region and said test pattern region, one among the openings being positioned on said impurity diffusing layer;

forming a metal film in said openings and on said insulating film;

patterning said metal film to form a wiring pattern; and actually testing a forming state of said metal film in said opening on said test pattern region by measuring a X-ray strength for said metal film when the X-ray is irradiated to said metal film in order to evaluate a forming state of said metal film in said opening on said product region;

the test being performed without destroying said substrate immediately after the formation of said metal film and before the patterning of said metal film.

15. A method claimed in claim 14, wherein:

said opening on said test pattern region has a narrower width than that on said product region, and the density of the openings on said test pattern is higher than that on said product region.

16. A method of testing a semiconductor device having a substrate, comprising the steps of:

dividing said substrate into a product region and a test pattern region;

forming an impurity diffusing layer in said product region;

forming an insulating film on said substrate;

forming openings in said insulating film on said product region and said test pattern region, one among the openings being positioned on said impurity diffusing layer;

forming a metal film in said openings and on said insulating film;

patterning said metal film to form a wiring pattern; and actually testing a forming state of said metal film in said opening on said test pattern region by measuring a depth distribution of said metal film obtained through Rutherford back scattering spectrometry in order to evaluate a forming state of said metal film in said opening on said product region;

the test being performed without destroying said substrate immediately after the formation of said metal film and before the patterning of said metal film.

17. A method claimed in claim 16, wherein:

said opening on said test pattern region has a narrower width than that on said product region, and the density of the openings on said test pattern is higher than that on said product region.

* * * * *